United States Patent

Ryan

[11] Patent Number: 5,930,587
[45] Date of Patent: Jul. 27, 1999

[54] STRESS MIGRATION EVALUATION METHOD

[75] Inventor: Vivian W. Ryan, Washington, N.J.

[73] Assignee: Lucent Technologies, Murray Hill, N.J.

[21] Appl. No.: 08/917,955

[22] Filed: Aug. 27, 1997

[51] Int. Cl.[6] ........................................... H01L 21/44
[52] U.S. Cl. .................. 438/14; 438/14; 438/799; 438/927; 438/663; 374/5; 374/57; 148/DIG. 3; 148/DIG. 162; 73/866
[58] Field of Search ................. 438/14, 927, FOR 468, 438/663, 799; 374/5, 57; 148/DIG. 3, DIG. 90, DIG. 162; 73/866

[56] References Cited

U.S. PATENT DOCUMENTS

| 5,001,541 | 3/1991 | Virkus et al. | 357/68 |
|---|---|---|---|
| 5,019,533 | 5/1991 | Cuddihy et al. | 438/199 |
| 5,031,456 | 7/1991 | Askwith et al. | 73/587 |
| 5,300,307 | 4/1994 | Frear et al. | 427/96 |
| 5,308,792 | 5/1994 | Okabayashi et al. | 438/180 |
| 5,407,863 | 4/1995 | Katsura et al. | 438/197 |
| 5,448,113 | 9/1995 | Suzuki et al. | 257/767 |
| 5,504,017 | 4/1996 | Yue et al. | 438/8 |
| 5,532,600 | 7/1996 | Hoshino | 324/537 |
| 5,565,380 | 10/1996 | Nemoto et al. | 438/198 |

OTHER PUBLICATIONS

Y. Sugano et al., Proceedings of the 26th Reliability Physics Symposium, p. 34, 1988.
Acceleration of Stress–Migration Failure in Aluminum Interconnect, by V. Ryan, S. A. Lytle, N.M. McCurry, D.P. Favreau and S. Chittipeddi, presented at Corrosion and Reliability of Electronic Materials and Devices—2nd International Symposium, Oct. 11–16, 1992; Proceedings—Electrochemical Society PV, 1993; 93–1, p: 11–22.

Primary Examiner—Olik Chaudhuri
Assistant Examiner—Kurt Eaton

[57] ABSTRACT

A method for accurately and objectively evaluating stress migration effects on long term reliability of integrated circuits. A sample containing a conductive runner is fabricated according to a given fabrication process. The fabricated sample undergoes a heating step at a first temperature for a first time period to induce material interactions at an accelerated rate, followed by cooling the sample to a second temperature and maintaining the second temperature for a time of sufficient duration such that relaxation occurs. Then the sample undergoes a heating process at a third temperature for a time sufficient to nucleate a predetermined number of voids, followed by heating the sample runner at a fourth temperature, less than than the third temperature, to propagate the voids such that a maximum void size is determined. Void distribution is preferably monitored by optical and scanning electron microscopy. By analyzing the void size distribution data for the isothermal void propagation annealing, a measure of the long term reliability is provided.

20 Claims, 2 Drawing Sheets

STRESS MIGRATION EVALUATION METHOD

TECHNICAL FIELD

The present invention relates generally to integrated circuits, and more particularly to a method for evaluating stress migration in interconnects.

BACKGROUND OF THE INVENTION

Integrated circuits are typically fabricated with multiple levels of patterned metallization electrically separated by interlayer dielectrics which contain vias at selected locations to provide electrical connections between the patterned metallization layers. As integrated circuits are scaled to smaller dimensions in a continual effort to provide increased performance (e.g., by increasing device speed and providing greater circuit functionality within a given area chip), the interconnect linewidth dimension becomes increasingly narrow which renders them more susceptible to deleterious effects such as electromigration and stress migration.

While electromigration refers to mass transport of the materials which comprise the interconnects in response to electrical current conduction, stress migration refers to mass transport of the interconnect material in response to mechanical stress gradients present in the interconnects which result from thermal expansion coefficient mismatches and compliance mismatches between the conductive runners and surrounding (e.g., overlying and/or underlying) dielectric materials. Depending on the thermal history, the stress may be either compressive or tensile. Tensile stress can cause void formation, whereas compressive stress can cause hillock formation. Voids continue to grow to reduce the stress until it is energetically unfavorable for them to continue to grow, and migrating voids may also coalesce with other voids thus providing an effective void growth mechanism.

For instance, consider the process of depositing an interlayer dielectric over an aluminum (Al) line (often termed "runner") which rests on a substrate or other dielectric material overlying a semiconductor substrate. Typically, such deposition is performed by chemical vapor deposition (CVD) at a temperature of at least 350° C. After deposition, as the structure cools toward room temperature, the Al line, having a thermal expansion coefficient much greater than the interlayer dielectric, wishes to contract more than the overlying interlayer dielectric. The interlayer dielectric, which has very good adhesion to the Al layer, prevents the Al line from contracting to its desired equilibrium length, thus resulting in a tensile stress in the Al line. The tensile stress is greatest at the edges of the line and decreases toward the center; hence there is a non-zero tensile stress gradient across the width of the line. This stress gradient corresponds to a chemical potential gradient which represents a thermodynamic driving force for mass transport. Accordingly, Al atoms diffuse to reduce the overall strain energy in the Al line. Over time, typically many months or several years, this mass transport of the conductive layer generates voids in the conductive runners which can lead to failure: the voids may entirely traverse the line (i.e., open circuit), or may reduce the cross-sectional area through which current may be conducted such that electromigration effects are exacerbated and/or current conduction causes a catastrophic thermal failure event.

Essential to improving the electromigration and stress migration properties of conductive runners, is a method for evaluating these effects. Particularly, such methods should accelerate the deterioration mechanisms which may take several years when the devices are subject to storage and/or to normal operating conditions, but must not introduce additional factors which would affect void formation and growth in a manner that would not occur under normal conditions and which would thus result in either false positives or false negatives with respect to interconnect reliability. That is, the evaluation method should mimic the deterioration mechanisms and processes present in the field, only at an accelerated rate such that evaluation is practicable and processing techniques for improving stress migration characteristics may be accurately and objectively characterized within a time frame suitable for developing current devices, and reliability of these devices may be accurately characterized.

Despite continuous efforts to evaluate interconnect reliability, failure of sub-micron width conductive runners due to voiding caused by stress migration has been observed by the present inventors, and by others, in devices fabricated according to processes which satisfied various known interconnect reliability tests, after being stored under normal storage conditions for many months to several years.

There remains a need, therefore, for further improvements in assessing stress migration, and particularly, a need for a stress migration evaluation method which accurately characterizes the deterioration mechanisms in, and long term reliability of, conductive runners fabricated according to various fabrication processes.

SUMMARY OF THE INVENTION

The present invention provides a method for accurately and objectively evaluating stress migration effects on long term reliability of integrated circuits. A sample containing a conductive runner is fabricated according to a given fabrication process. In accordance with the present invention, the fabricated sample undergoes a heating step at a first temperature for a first time period to induce material interactions at an accelerated rate, followed by cooling the sample using a controlled ramp rate to a second temperature and maintaining the second temperature for a time of sufficient duration such that relaxation occurs. Then the sample undergoes a heating process at a third temperature for a time sufficient to nucleate a predetermined number of voids, followed by heating the sample runner at a fourth temperature, less than than the third temperature, to propagate the voids such that a maximum void size is determined. Void distribution is preferably monitored by optical and scanning electron microscopy. By analyzing the void size distribution data for the isothermal void propagation annealing, a measure of the long term reliability is provided.

BRIEF DESCRIPTION OF THE DRAWINGS

Additional aspects, features, objects, and advantages of the invention will be understood and will become more readily apparent when the invention is considered in the light of the following description made in conjunction with the accompanying drawings, wherein.

DETAILED DESCRIPTION OF THE PREFERRED EMBODIMENT

Figure 1:
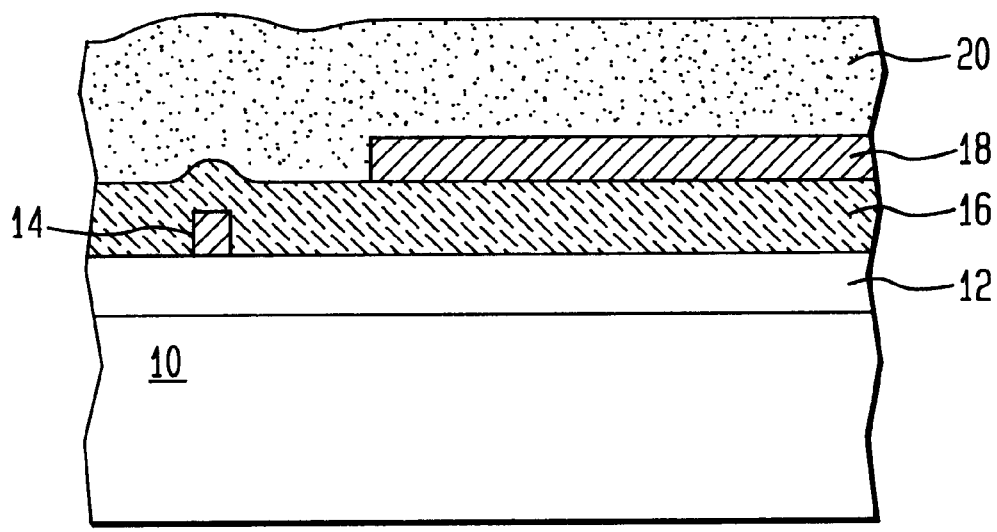
FIG. 1 illustrates a portion of conductive runner test patterns for flow diagram illustrating steps including an embodiment of the present invention.

Referring to FIG. 1, there is schematically shown a device cross-section including a semiconductor (e.g., silicon) substrate 10, a dielectric layer 12, a first level conductive runner 14 (transverse to its length), an intermetal dielectric layer 16, a second level conductive runner 18 (along its length), and an encapsulating dielectric layer 20. Dielectric layer 12, intermetal dielectric layer 16, and encapsulating dielectric layer 20, may each be any one of, for example, the following: a deposited (e.g., chemical vapor deposition) oxide, a spin-on-glass (SOG) film, a CVD deposited silicon nitride or silicon oxynitride, or a polymer (e.g., polyimide). In addition, dielectric layer 12 may be a thermally grown oxide. Each of the first and second level conductive runners 14 and 18 may be, for example, a metal such as aluminum (Al) or an Al alloy (e.g., 0.5% copper, 0.75% silicon), copper (Cu) or a Cu alloy, a polycide, or a multilayer conductor (e.g., refractory barrier layer under Al or an Al alloy), etc.

It is understood that for purposes of clarity of exposition FIG. 1 is merely illustrative of a portion of a double-metal structure which includes straight-line sections of conductive runners 14 and 18. It is understood that additional or fewer conductive layers may be provided, and that a single semiconductor chip may include different regions having different numbers of conductive layers. Further, preferably conductive runner test patterns of various lengths, plan-view topologies (e.g., straight lines, meanders), underlying topographies (e.g., planar dielectric layer, non-planar dielectric layers with a range of step heights and step periods), and overlying structure (e.g., conductive pattern of second conductive layer overlying first level conductive runner test pattern) are provided. Metal vias connecting different conductive layers may also be included. Additional parameters which may be varied for different test patterns or different test batches include interconductive layer separation, dielectric layer thicknesses and step coverage, and material deposition parameters (e.g., temperature, rate).

As may be further understood hereinbelow, for purposes of evaluating stress migration for various semiconductor fabrication processes, such test structures are fabricated in accordance with the steps of complete semiconductor fabrication processes and preferably comprise every die of the wafers being processed such that experimental test matrices of annealing cycles according to the present invention may be implemented to determine the stress migration effects on long term reliability with statistical significance. As may be further appreciated, however, such test patterns are preferably also incorporated as process monitors into an integrated circuit fabrication process in order to assess the interconnect integrity and reliability for the concurrently fabricated integrated circuits in order to ensure that any drifts in the process do not compromise interconnect reliability with respect to stress migration.

Figure 2:
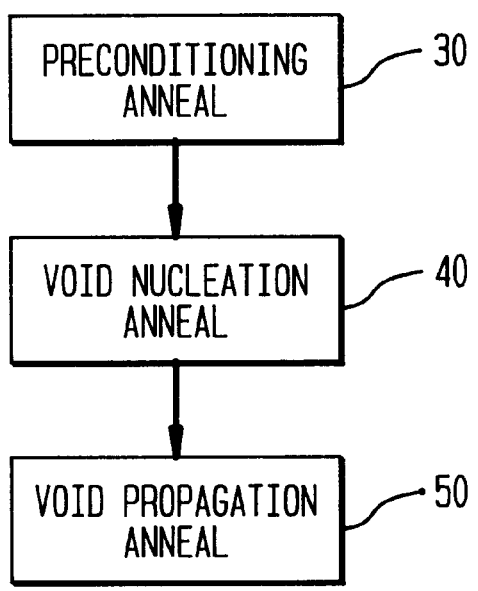
FIG. 2 is a flow diagram illustrating steps including an embodiment for stress migration evaluation according to the present invention.

Referring now to FIG. 2, there is shown a flow diagram illustrating a stress migration evaluation method applied to fabricated test structures according to an embodiment of the present invention. In step 30, a pre-conditioning anneal is performed to effect material interactions which would normally occur over an extended time frame. Then, in step 40, a second annealing procedure is implemented in order to nucleate voids in the test structures until the number of voids generated essentially saturates. Next, in step 50, a third annealing step at a temperature lower than that used in the second annealing procedure is applied to the test structures in order to propagate the voids to their maximum size. Void nucleation and void growth are preferably characterized over time by microscopy. By preferably using experimental test matrices and/or finite-element method computer simulations to assess a range of annealing parameters (e.g., temperature, time, heating and cooling rates, etc.) on material interactions, void nucleation, and void growth, the long term reliability of the various interconnect test structures fabricated according to various fabrication process parameters and sequences may be assessed accurately in order to optimize a semiconductor fabrication process with respect stress migration effects.

More specifically, preconditioning anneal step 30 drives interactions which would occur in fabricated devices over time under normal conditions, such that subsequent annealing steps for void nucleation and growth rely on, an only on, mechanisms which would normally be present when void nucleation and growth are not accelerated. These interactions include, for example, material interdiffusion and reaction with any residual water in the dielectric layers and/or interfaces. For example, if the conductive runner metallization were formed from Al overlying a refractory barrier layer (e.g., titanium nitride) and the interlayer dielectric were formed from CVD $SiO_2$ (possibly doped with fluorine), then interdiffusion of the refractory metal and the Al, diffusion of Si from the dielectric material into Al grain boundaries, and reaction of Al with water and fluorine dopant in the dielectric would be monitored. These interactions may be monitored by various techniques such as microscopy (e.g., optical, scanning electron microscopy (SEM)), electron diffraction, and various elemental and surface analysis techniques (e.g., Auger electron spectroscopy (AES), as well as AES depth profiling, Rutherford backscatter spectroscopy (RBS), x-ray photoelectron spectroscopy (XPS), and secondary ion mass spectroscopy (SIMS)). Preferably, the results from these measurements are compared with those of devices stored under normal conditions for several months or years to ensure that the preconditioning annealing step comparably effects the reactions. An experimental test matrix over a range of pre-conditioning (isothermal) anneal temperatures and times is preferably employed. It may be understood that a range of temperature/time combinations from among the experimental test matrix may provide for the desired material interactions without introducing interactions which would not normally occur. Similarly, the ramp-up time for the anneal is selected to be of sufficient duration so as to not introduce artifacts or cause effects which would not normally occur (e.g., dielectric cracking due to thermal shock). It is noted that preconditioning anneal step 30 not only ensures that void nucleation and growth proceeds from a state which would normally occur in the field, but also significantly decreases the overall time to effect stress migration evaluation.

After the material interactions have occurred, the samples are cooled down, preferably to room temperature, at a rate which ensures that there is no rapid quenching of material interactions (e.g., there is quasi-thermodynamic equilibrium as the temperature decreases). Then, in accordance with the present invention, the test structures are maintained at room temperature for a time period of sufficient duration for the stress and Al microstructure to achieve nominal room temperature equilibrium values, which is tantamount to ensuring that a reasonably low energy state has been achieved at room temperature prior to the subsequent annealing step for accelerating void nucleation.

Then, in step 40, a void nucleation isothermal anneal is performed. Again an experimental test matrix of temperatures and times is preferably employed, and ramp-up time is of sufficient duration to avoid deleterious artifacts. Preferably, in order to characterize the void nucleation process, void size and number are monitored over time until there is negligible or insignificant increase, or effective saturation (e.g., nucleation of at least about 80% of total number of voids which would ultimately nucleate, as indicated by certain samples in the experimental matrix which are annealed to saturation, and/or by fitting measured nucleation-time data to estimate saturation level) in the number and size of voids present.

After void nucleation is thus completed, the temperature is reduced, either to the temperature used in subsequent step 50 for void propagation or to room temperature. The ramp-down time is again of sufficient duration to avoid quenching or other deleterious effects which would not normally occur. If the temperature is reduced to below the temperature used in step 50 (e.g., reduced to room temperature), the samples are allowed to equilibrate at the reduced temperature prior to slow ramping up to the step 50 temperature.

In any event, in step 50, in order to accelerate void propagation to the maximum void size that would be achieved over time without acceleration, the samples are annealed at a temperature greater than room temperature and less than the temperature used to saturate void nucleation in step 40. Void propagation (i.e., void growth) is observed over time. Again, an experimental matrix of temperature and times are used. It may be appreciated that, under many device fabrication conditions, the stress in the conductive runner increases as the temperature decreases due to thermal expansion coefficient mismatch with surrounding materials (dielectrics). It is also understood that while the stress increases as the temperature decreases, atomic diffusivity increases with increasing temperature. Accordingly, it may be understood that in order to accelerate void propagation to their maximum size due to stress migration, there is a preferred temperature or temperature range less than the void nucleation annealing temperature but greater than room temperature.

For the void nucleation and propagation steps, void size and number may be measured by an automated video-image analysis system (e.g., JAVA, Jandel Scientific, Corte Madera, Calif.) which includes optical (e.g., magnification of 2000) and scanning electron (backscatter-mode) microscopes, and which automatically counts voids and measures their size, and permits setting a minimum threshold size.

Based on the foregoing stress migration testing, the maximum void size achieved is representative of the maximum void size which would occur over an extended period of time under normal conditions. By analyzing the measured void nucleation and propagation annealing results, the lifetime of the interconnects may be determined. For instance, since, as described, void size and number is measured for experimental test matrices of different isothermal annealing times and temperatures, it is possible to fit various isothermal annealing data to extrapolate a lifetime (or, similarly, a failure rate) under normal temperature conditions. For example, as may be appreciated, data analysis may include analysis of one or more of the following relationships.

1) For a given nucleation anneal, number of voids of size greater than some threshold (e.g., greater than 90% of the linewidth) may be represented as a function of time for each propagation annealing temperature (i.e., void number isotherms).

2) For a given nucleation anneal, maximum void size (e.g., as a percentage of linewidth) may be represented as a function of void propagation annealing temperature.

3) For a given nucleation anneal, some measure of the void size distribution (e.g., mean, size at a given percentile) may be represented as a function of time for each isothermal propagation anneal.

4) For a given nucleation anneal, the time for some percentage of the total number of voids to be of at least a certain size (e.g., 10% of voids greater than 30% of the linewidth) may be represented as a function of isothermal annealing temperature.

It may be appreciated that such data analysis may, for example, reflect certain parameters (e.g., activation energies) of the underlying mechanisms driving stress migration and preferably such fitting is based on a model which reflects the underlying physical mechanisms (e.g., stress-field assisted diffusion). As may be appreciated, however, various data measured over the experimental test matrix should be carefully considered to ensure that data relied upon for determining lifetime reflect common void nucleation and propagation mechanisms (e.g., data curves are fit by a common model and/or data curves are homologous with respect to the model).

The following example is presented to illustrate features and characteristics of the present invention, which is not to be construed as being limited thereto.

EXAMPLE 1

In this example, stress migration was evaluated according to the present invention for a semiconductor fabrication process which employed three levels of metal with submicron width conductive runners. It had been observed that integrated circuits which were previously fabricated according to this fabrication process exhibited failure due to voiding after being stored under normal, room temperature conditions for approximately six months to one year, despite successfully passing other conventional interconnect reliability tests.

In particular, the fabrication process employed conductive runner test structures of Al overlying a refractory barrier layer and underlying a thin refractory anti-reflective layer, and with $SiO_2$ interlayer dielectrics. Following the fabrication process, the conductive runner test structures underwent the following steps, in order, for evaluating stress migration effects in accordance with the present invention.

1) Isothermal preconditioning annealing over an experimental matrix ranging from 180° C. to 210° C. Electron diffraction techniques were used to observe Si diffusion into the Al grain boundaries until a dispersion typical of long-term shelved devices was observed. The samples were cooled down to room temperature using a linear ramp rate over a 200 hour time period, and remained at room temperature for 48 hours to ensure relaxation.

2) Isothermal void nucleation annealing over an experimental matrix ranging from 200 C. to 220 C. until void nucleation saturated at each isothermal annealing temperature. Void size distribution (i.e., number of voids as a function of size) was monitored by various optical microscopy (2000×) and scanning electron microscopy using an automated equipment setup.

3) Isothermal void propagation annealing over an experimental test matrix of 80° C. to 200 C. until void size saturated at each isothermal annealing temperature. Void size distribution (i.e., number of voids as a function of size) was monitored by various optical microscopy (2000×) and scanning electron microscopy using an automated equipment setup.

It was observed that samples which underwent an isothermal void nucleation annealing temperature which resulted in nucleation of at least about 80% of the maximum number of voids which were observed to nucleate at any annealing temperature were reliable in determining maximum void size or penetration when subject to isothermal void propagation annealing. Stated alternatively, samples in which isothermal void nucleation annealing produced less than 80% of the maximum number of void nucleation sites were not found to be reliable indicators of maximum void size (penetration) regardless of the isothermal void propagation annealing conditions (temperature, time).

Samples were also run without a preconditioning anneal, and the preconditioning anneal was shown to dramatically reduce the isothermal time-to-nucleate voids according to the relation $t_{N1}=AF \cdot t_{N2}$, where $t_{N1}$ and $t_{N2}$ are nucleation times at temperatures $T_1$ and $T_2$ (°K), respectively, and the acceleration factor, AF, is given by:

$$AF = e^{\Gamma(T) \cdot [T_1^{-1} - T_2^{-1}]}$$

where $\Gamma(T)$ is a function of temperature (median $2 \times 10^3$) that accounts for an incubation period (e.g., for material interactions) observed during preconditioning isothermal anneals.

Void nucleation and growth events fit different acceleration models. Nucleation data fit an Arrhenius model reasonably well, with a single effective activation energy. A standard Arrhenius model, however, poorly described the growth (propagation) data. For void propagation, the kinetics of failure, at a given size criterion, was better described by an empirical Eyring algorithm based on two acceleration factors, temp (T) and stress (σ), such that:

$$t|_T \alpha \sigma^{-\alpha} \cdot e^{Q/kT}$$

where t is the time (after the preconditioning anneal) to reach the given size at temp T (°K), and k is Boltzmann's constant. Q and n are fit parameters, and the stress a is also a function of temperature which can be approximated as:

$$\sigma \alpha (T_c - T)$$

where $T_c$ is a critical maximum temperature (approximately 250° C.) related to the threshold stress for void growth.

This two-factor Eyring model for growth, with a temperature-dependent preexponential term to compensate for changeability in mechanical stress, is physically realistic, as further supported by more detailed finite element analysis simulations which were performed and which showed that nucleation is largely accounted for by atomic diffusion, whereas propagation is assisted by the macroscopic stress-concentration factor at the forward tip of the void.

Figure 3:
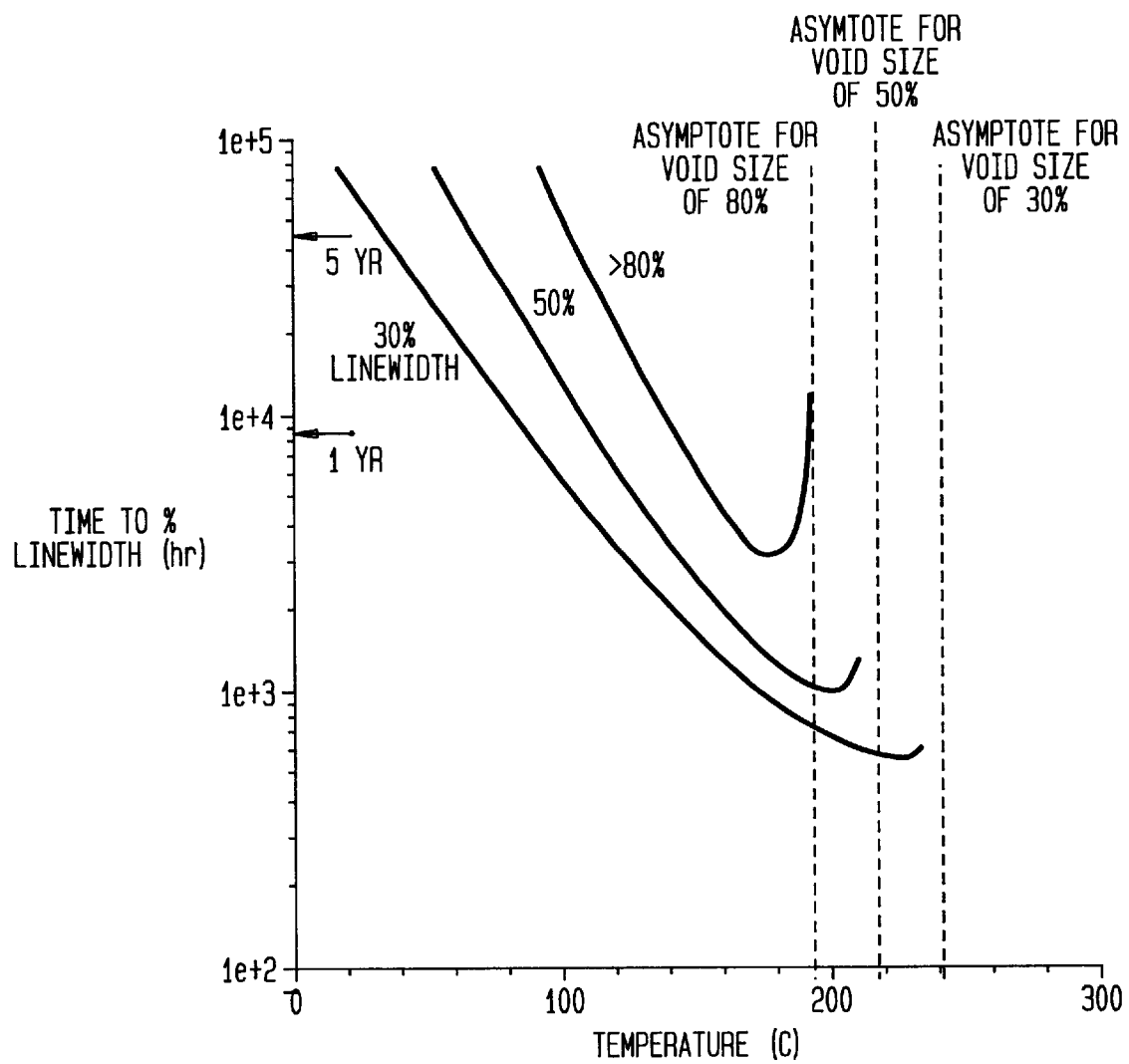
FIG. 3 shows contours for time to grow voids to given size as a function of isothermal temperature, based on fitting data measured in accordance with the present invention.

Based on the data analysis (e.g., best fit) of the void size (represented as a percentage of linewidth) as a function of time for isothermal anneals according to the two-factor Eyring model, the time for growing voids to a given size may be represented as a function of isothermal temperature, as shown by the contours in FIG. 3. Accordingly, the long term stress migration reliability for a given temperature may be estimated.

Thus, as illustrated through the preferred embodiment and the foregoing examples, and as understood by further practicing the present invention, many advantages and attendant advantages are provided by the present invention, which provides a stress migration evaluation method which grows stress migration voids to saturated maximum size, as rapidly as possible, without introducing propagation mechanisms that are not present under normal operating conditions. Such a method allows for objectively determining the stress migration failure rate and reliability of various semiconductor fabrication processes such that improved and/or optimized processes (e.g., by optimizing metal thicknesses, dielectric thicknesses, material choices, design rules, annealing cycles, metal and dielectric deposition parameters, etc.) may be developed within a reasonably short period of time. Further, the stress migration evaluation method according to the present invention provides for an in-process stress migration monitor which is not heretofore available: as described, although stress migration effects can be fatal, particularly for sub-micron interconnect linewidths, conventional interconnect testing techniques do not adequately evaluate stress migration effects and thus provide false negatives.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope and without diminishing its attendant advantages. It is therefore intended that the present invention is not limited to the disclosed embodiments but should be defined in accordance with the claims which follow.

I claim:

1. A method for evaluating stress migration effects on a conductive runner fabricated according to a given fabrication process, said method comprising the steps of:
   heating said runner at a first temperature for a first time period to induce material interactions at an accelerated rate, said runner fabricated according to said given fabrication process;
   cooling said runner to a second temperature, and maintaining said second temperature for a time of sufficient duration such that relaxation occurs;
   heating said runner at a third temperature for a time sufficient to nucleate a predetermined number of voids;
   heating said runner at a fourth temperature, less than said third temperature and greater than room temperature, to propagate said voids such that a maximum void size is determined.

2. The method according to claim 1, further comprising the step of analyzing void size distribution as a function of said fourth temperature and time for heating at said fourth temperature to provide a measure of reliability for said conductive runner fabricated according to said given fabrication process.

3. The method according to claim 1, wherein the step of heating said runner at a third temperature includes observing void size distribution over time.

4. The method according to claim 1, wherein the step of heating said runner at a fourth temperature includes observing void size distribution over time.

5. The method according to claim 1, wherein the step of heating said runner at a first temperature includes observing said material interactions over time.

6. The method according to claim 5, wherein said material interactions include interdiffusion which are observed by elemental analysis techniques.

7. The method according to claim 1, wherein said third temperature is selected such that void nucleation results in at least about 80% of a maximum possible number of nucleated voids.

8. The method according to claim 1, wherein said conductive runner is surrounded by dielectric material.

9. The method according to claim 1, wherein said heating steps are applied to different conductive runner samples to provide an experimental test matrix of heating temperatures or times.

10. The method according to claim 1, wherein said heating and cooling steps are applied to different samples having conductive runners fabricated according to different processing parameters in order to optimize a fabrication process with respect to stress migration.

11. The method according to claim 10, wherein the different processing parameters include at least one of runner thickness, dielectric thickness, runner material, dielectric material, design rules, annealing cycles, runner deposition parameters, and dielectric deposition parameters.

12. The method according to claim 1, further comprising the step, subsequent to said step of heating at said third temperature, of cooling said conductive runner to a temperature less than said fourth temperature prior to the step of heating said runner at the fourth temperature.

13. A method for fabricating integrated circuits, comprising the steps of:

forming at least one conductive runner layer or at least one interlayer dielectric according to processing parameters predetermined based on executing a stress migration evaluation method on each of an array of conductive runner samples fabricated according to respective processing parameters, the stress migration evaluation method comprising the steps of:

heating the conductive runner sample at a first temperature for a first time period to induce material interactions at an accelerated rate;

cooling the conductive runner sample to a second temperature, and maintaining said second temperature for a time of sufficient duration such that relaxation occurs;

heating the conductive runner sample at a third temperature for a time sufficient to nucleate a predetermined number of voids;

heating the conductive runner sample at a fourth temperature, less than said third temperature and greater than room temperature, to propagate said voids such that a maximum void size is determined.

14. The method according to claim 13, wherein for each conductive runner sample fabricated according to respective processing parameters said heating steps are applied to different conductive runner sub-samples to provide an experimental test matrix of heating temperatures or times.

15. The method according to claim 13, wherein said step of forming at least one conductive runner layer or at least one interlayer dielectric includes the steps of depositing and patterning a first conductive material to provide a patterned conductive runner layer, and depositing an insulating layer over said patterned conductive runner layer.

16. The method according to claim 13, wherein the respective processing parameters include at least one of of runner thickness, dielectric thickness, runner material, dielectric material, design rules, annealing cycles, runner deposition parameters, and dielectric deposition parameters.

17. An integrated circuit comprising an interconnect conductive layer or an interlayer dielectric formed according to a process which is predetermined based on executing a stress migration evaluation method on each of an array of conductive runner samples fabricated according to respective processing parameters, the stress migration evaluation method comprising the steps of:

heating the conductive runner sample at a first temperature for a first time period to induce material interactions at an accelerated rate;

cooling the conductive runner sample to a second temperature, and maintaining said second temperature for a time of sufficient duration such that relaxation occurs;

heating the conductive runner sample at a third temperature for a time sufficient to nucleate a predetermined number of voids;

heating the conductive runner sample at a fourth temperature, less than said third temperature and greater than room temperature, to propagate said voids such that a maximum void size is determined.

18. The integrated circuit according to claim 17, wherein for each conductive runner sample fabricated according to respective processing parameters said heating steps are applied to different conductive runner sub-samples to provide an experimental test matrix of heating temperatures or times.

19. The integrated circuit according to claim 17, wherein said step of forming at least one conductive runner layer or at least one interlayer dielectric includes the steps of depositing and patterning a first conductive material to provide a patterned conductive runner layer, and depositing an insulating layer over said patterned conductive runner layer.

20. The integrated circuit according to claim 17, wherein the respective processing parameters include at least one of of runner thickness, dielectric thickness, runner material, dielectric material, design rules, annealing cycles, runner deposition parameters, and dielectric deposition parameters.

\* \* \* \* \*